United States Patent [19]

Matsusaka et al.

[11] Patent Number: 4,959,510
[45] Date of Patent: Sep. 25, 1990

[54] PRINTED CIRCUIT BOARD

[75] Inventors: Yoshiki Matsusaka; Susumu Ushiki, both of Tokyo, Japan

[73] Assignee: Oki Electric Industry Co., Ltd., Tokyo, Japan

[21] Appl. No.: 354,221

[22] Filed: May 19, 1989

[30] Foreign Application Priority Data

May 25, 1988 [JP] Japan .................................. 63-125797

[51] Int. Cl.⁵ .............................................. H05K 1/00
[52] U.S. Cl. ...................................... 174/261; 29/854; 174/257; 361/403
[58] Field of Search ....................... 174/68.5, 260, 257, 174/261; 29/854; 361/403

[56] References Cited

U.S. PATENT DOCUMENTS

| | | | |
|---|---|---|---|
| 3,902,790 | 9/1975 | Hsieh et al. | 174/68.5 X |
| 3,936,930 | 2/1976 | Stern | 174/68.5 X |
| 4,227,039 | 10/1980 | Shibasaki et al. | 174/68.5 |
| 4,835,061 | 5/1989 | Ohta et al. | 174/68.5 X |

FOREIGN PATENT DOCUMENTS 52-131160 11/1977 Japan .

Primary Examiner—Morris H. Nimmo
Attorney, Agent, or Firm—Wenderoth, Lind & Ponack

[57] ABSTRACT

In a printed circuit board having a glass substrate, signal line conductors having uniform resistances are formed of a thin film of ITO or $SnO_2$ alone, while a power supply conductor whose voltage drop is small is formed of a film of ITO or $SnO_2$, a film of Ni plating, a film of Au plating and a thick film of metal formed of plating or paste. Bonding pads are formed of a thin film of ITO or $SnO_2$, a film of Ni plating and a film of Au plating.

8 Claims, 3 Drawing Sheets

PRINTED CIRCUIT BOARD

BACKGROUND OF THE INVENTION

The present invention relates to a printed circuit board and a method of producing the printed circuit board.

The present invention has particular utility in a printed circuit board on which a plurality of signal line conductors are provided to connect a plurality of devices or components which are to be mounted thereon, and on which power supply conductors are formed to provide a power supply to the mounted devices.

An example of such a printed circuit board is a strip-shaped printed circuit board for mounting an array of super-miniature LEDs (light-emitting diodes) therealong. A thick power supply conductor is formed to extend along the length of the strip-shaped printed circuit board, and a plurality of signal line conductors connect respective LEDs to the power supply conductor.

In a prior-art printed circuit board in which the substrate is a glass sheet, the conductors are formed of a thin film of indium-tin oxide (ITO) or tin oxide ($SnO_2$), and a Ni plating layer and an Au plating layer which are formed in turn, and are patterned by etching. It is also known to form a metal paste layer or a thick metal plating layer over the Ni plating layer to further reduce the electrical resistance.

However, the prior art suffers from substantial variation between the signal line conductors and cannot provide even currents to all the LEDs. The variation can be as much as ± about 30%.

SUMMARY OF THE INVENTION

An object of the invention is to eliminate the above problems.

Another object of the invention is to provide a printed circuit board in which the voltage drop along the length of the power supply conductor is small and the variation in the resistance between the signal line conductors is small.

The present invention has been accomplished by recognizing that variation in the resistance from one signal line conductor to another must be small and that the voltage drop along the length of the power supply line conductor must be small.

According to the present invention, the power supply conductor is formed of a thin film of indium-tin oxide or tin oxide, a metal plating layer formed on the thin film, and a metal paste layer or thick metal plating layer formed on the metal plating layer, while the signal line conductors are formed of a thin film of indium-tin oxide or tin oxide alone.

DETAILED DESCRIPTION OF THE INVENTION

Figure 1:
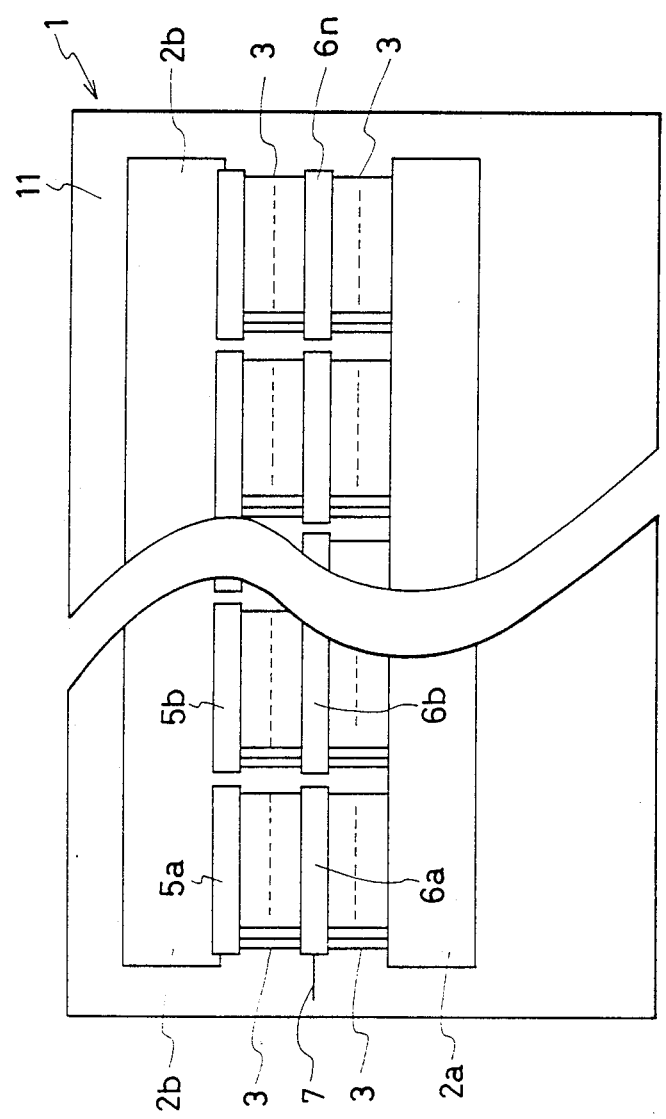
FIG. 1 is a plan view showing a printed circuit board, according to an embodiment of the invention, having devices mounted thereon.

A printed circuit board of an embodiment of the invention will now be described with reference to FIGS. 1 to 4C.

A substrate 11 of the printed circuit board, denoted by reference numeral 1, of the illustrated embodiment is a transparent glass sheet. Power supply conductors 2a and 2b and signal line conductors 3 are formed on the substrate 11. Mounted on the substrate 11 are super-miniature LED (light-emitting diode) IC chips 5a, 5b, . . . 5n and driver IC chips 6a, 6b, . . . 6n.

Figure 2:
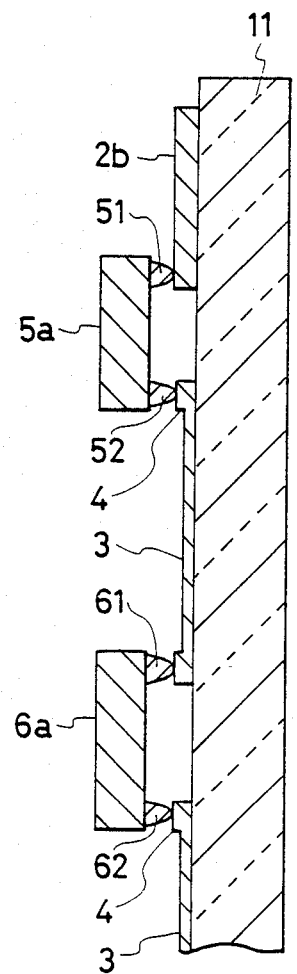
FIG. 2 is a cross-sectional side view of the printed circuit board of FIG. 1.
Figure 3:
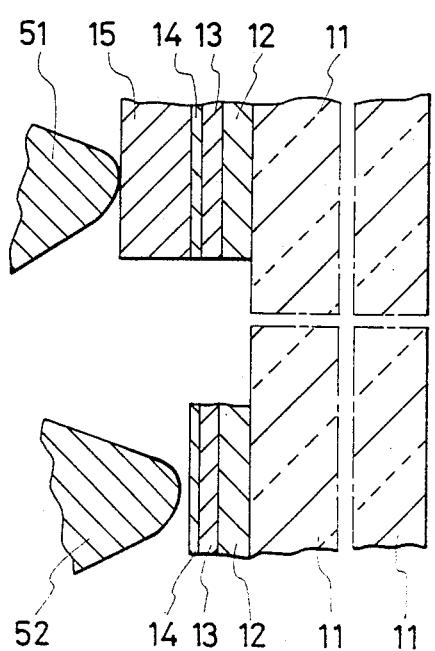
FIG. 3 is a cross-sectional enlarged partial side view of the printed circuit board of FIGS. 1 and 2.

The substrate 11 of this embodiment is strip-shaped. The LED IC chips 5a to 5n having LED elements therein are arranged in a line along the length of the substrate 11. Although not illustrated as such, the LED elements (light-emitting parts of the LED IC chips) face downward (or toward the right as seen in FIG. 2 and FIG. 3). The driver IC chips 6a to 6n are arranged in a line along the length of the substrate 11, i.e. in parallel with the LED IC chips 5a to 5n. For the purpose of explanation of the invention, the driver IC chips 6a to 6n may be considered as an array of switches which are provided in association with respective LED elements, and selectively closed or opened in accordance with control signals. The control signals can be supplied via a conductor 7 to one end of the array of driver IC chips 6a to 6n and conducted along the array of driver IC chips 6a to 6n.

A plurality of the signal line conductors 3 are provided in association with the respective LED elements of the LED IC chips 5a to 5n and connect the associated LED elements of the IC chips 5a to 5n, through respective switches (the driver IC chips 6a to 6n), to a first power supply conductor 2a.

The LED IC chips 5a to 5n are provided with two sets or arrays of solder bumps 51 and 52. The solder bumps 52 of the first set are soldered to bonding pads 4 on the signal line conductors 3. The solder bumps 51 of the second set are soldered to a second power supply conductor 2b.

The driver IC chips 6a to 6n are provided with two sets or arrays of solder bumps 61 and 62 which are soldered to bonding pads 4 on respective ones of the signal line conductors 3.

The signal line conductors 3 are formed of a thin film 12 of indium-tin oxide (ITO) or tin-oxide ($SnO_2$) on the substrate 11.

The power supply conductors 2a and 2b are formed of a thin film 12 of indium-tin oxide (ITO) or tin-oxide ($SnO_2$) on the substrate 11, a layer 13 of Ni plating, a layer 14 of Au plating, and a relatively thick layer 15 of metal paste, such as Au paste.

The bonding pads 4 are formed of a thin film 12 of indium-tin oxide (ITO) or tin-oxide ($SnO_2$) on the substrate 11, a layer 13 of Ni plating, and a layer 14 of Au plating.

The thin film 12 of ITO or $SnO_2$ adheres well to both the glass sheet 11 and the Ni plating layer 13, so it serves to enhance the bond strength between the glass sheet 11 and the Ni plating layer 13. The Ni plating layer 13 adheres well to both the thin film 12 and the Au plating layer 14, so it serves to enhance the bond strength between the Au plating layer 14 and the thin film 12. The Au plating layer 14 has good soldering properties. The provision of the thick metal layer 15 reduces the resistance of the power supply conductors 2a and 2b.

As an example, the thickness of the metal paste layer 15 is about 10 μm, the thickness of the Ni plating layer 13 is about 1.0 μm, and the thickness of the Au plating layer 14 is about 0.1 μm.

Now the process for the fabrication of the above-described printed circuit board is described with reference to FIG. 4A, FIG. 4B and FIG. 4C.

Figure 4A:
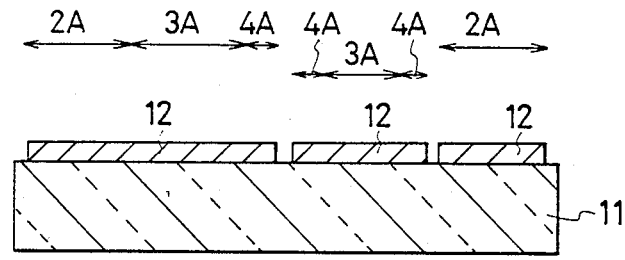
FIG. 4A, FIG. 4B and FIG. 4C are cross-sectional side views of the printed circuit board showing how respective layers thereof are stacked.
Figure 4B:
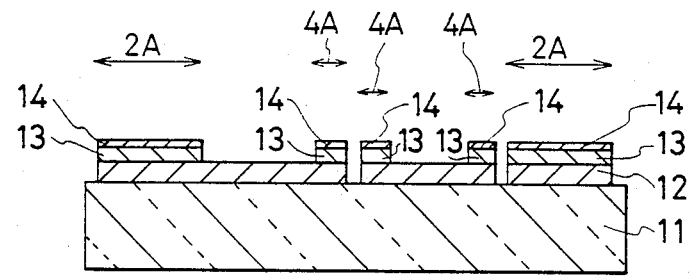
Figure 4C:
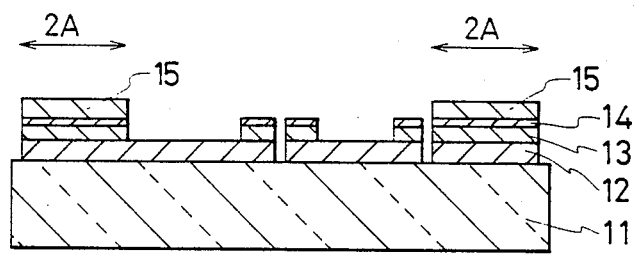

First, a thin film 12 of indium-tin oxide (ITO) or tin-oxide (SnO$_2$) is formed on the glass sheet 11 by vapor deposition and then patterned by etching to leave a pattern of the thin film in the region 2A for the power supply conductors 2a, 2b, in the region 3A for the signal line conductors 3, and in the region 4A for the bonding pads 4, as shown in FIG. 4A. The specific configuration, e.g. the lengths and widths of each region, is decided on the basis of functions and performance desired of the devices to be mounted.

The layer 13 of Ni plating is then formed for example by electrolysis plating on the thin film 12 of ITO or SnO$_2$. The layer 14 of Au plating is then formed, for example, by electrolysis plating on the Ni plating layer 13. The Ni plating layer 13 and the Au plating layer 14 are formed in the regions 2A and 4A for the power supply conductors 2a and 2b and the bonding pads 4, as shown in FIG. 4B.

The layer 15 of the metal paste is then formed for example by screen printing on the Au plating layer 14. The metal paste layer 15 is formed in the region 2A for the power supply conductors 2a and 2b, as shown in FIG. 4C.

The signal line conductors 3 must be formed such that variations between the currents to the mounted devices are small, but it is not necessary for the resistance of the conductor to be very low. Accordingly, it is only necessary to provide the thin film 12, not the Ni plating layer or the Au plating layer, in the region 3A.

In another embodiment of the invention, a thick metal plating layer of Au or the like is provided in place of the metal paste layer. As an example, the thickness of the thick metal plating layer is about 10 μm, the thickness of the Ni plating layer 13 is about 1.0 μm, and the thickness of the Au plating layer 14 is about 0.1 μm. Use of a thick metal plating layer can reduce the resistance and the voltage drop along the length of the power supply conductor.

The thick metal plating layer can be formed by, for example, the electrolysis plating method by which metal such as Au can be chemically reduced and deposited to form a thick layer.

As has been described, according to the invention, the variation in the resistance between the signal line conductors is small, the voltage drop along the power supply conductor is small, and good solder properties are ensured at the bonding pads.

A further advantage of the invention is that the required quantity of plating material such as Au or Ni is reduced.

What is claimed is:

1. A printed circuit board adapted for mounting devices thereon, comprising:
    a glass sheet;
    a power supply conductor, mounted on said glass sheet in a power supply conductor region thereof, for conducting power for the devices;
    bonding pads mounted on said glass sheet in bonding pad regions thereof;
    signal line conductors, mounted on said glass sheet in signal line conductor regions thereof, for conducting signals for the devices;
    said power supply conductor, said bonding pads and said signal line conductors each comprise a first layer of a thin film of indium-tin oxide or tin oxide formed on said glass sheet in said power supply conductor region, said bonding pad conductor regions and said signal line conductor regions, respectively;
    said power supply conductor and said bonding pads each further comprise a second layer of conductive metal formed on said first layer in said power supply conductor region and said bonding pad regions, respectively; and
    said power supply conductor further comprises a third layer of a relatively thick conductive metal formed on said second layer in said power supply conductor region.

2. A printed circuit board according to claim 1, wherein said second layer comprises a Ni layer formed on said thin film, and an Au layer formed on said Ni layer.

3. A printed circuit board according to claim 2, wherein said Ni layer has a thickness on the order of 1.0 μm.

4. A printed circuit board according to claim 2, wherein said Au layer has a thickness on the order of 0.1 μm.

5. A printed circuit board according to claim 2, wherein said third layer has a thickness on the order of 10 μm.

6. A printed circuit board according to claim 1, wherein said third metal layer is formed of Au.

7. A method of producing a printed circuit board, adapted for mounting devices thereon and comprising a glass sheet, a power supply conductor mounted on the glass sheet in a power supply conductor region thereof for conducting power for the devices, bonding pads mounted on the glass sheet in bonding pad regions thereof, and signal line conductors mounted on the glass sheet in signal line conductor regions thereof for conducting signals for the devices, comprising the steps of:
    providing the glass sheet;
    forming a thin film of indium-tin oxide or tin oxide on the glass sheet in the power supply conductor region, the bonding pad regions and the signal line conductor regions;
    forming a first metal plating layer on said thin film in the power supply conductor region and the bonding pad regions; and
    forming a metal paste layer or a second, relatively thick, metal plating layer on said first metal plating layer in the power supply conductor region.

8. A method according to claim 7, wherein said step of forming said thin film comprises forming a thin film by vapor deposition and etching said thin film to form a pattern.

* * * * *